United States Patent
Hsu et al.

(10) Patent No.: US 10,712,366 B2
(45) Date of Patent: Jul. 14, 2020

(54) ELECTRICAL PROBE

(71) Applicant: CHROMA ATE INC., Taoyuan (TW)

(72) Inventors: Hsu-Chang Hsu, Tao-Yuan Hsien (TW); Kuo-Yen Hsu, Tao-Yuan Hsien (TW); Chuan-Tse Lin, Tao-Yuan Hsien (TW)

(73) Assignee: CHROMA ATE INC., Taoyuan (TW)

( * ) Notice: Subject to any disclaimer, the term of this patent is extended or adjusted under 35 U.S.C. 154(b) by 86 days.

(21) Appl. No.: 16/222,391

(22) Filed: Dec. 17, 2018

(65) Prior Publication Data

US 2019/0195911 A1 Jun. 27, 2019

(30) Foreign Application Priority Data

Dec. 27, 2017 (TW) .............................. 106145876 A (51) Int. Cl.
*G01R 1/067* (2006.01)

(52) U.S. Cl.
CPC ..... *G01R 1/06755* (2013.01); *G01R 1/06722* (2013.01); *G01R 1/06733* (2013.01)

(58) Field of Classification Search
CPC ............ G01R 1/06755; G01R 1/06733; G01R 1/06722
See application file for complete search history.

(56) References Cited

U.S. PATENT DOCUMENTS

| 8,651,900 B1 * | 2/2014 | Hsu | H01R 13/2421 439/700 |
| 2014/0115891 A1 * | 5/2014 | Hsu | C25D 5/48 29/874 |
| 2017/0122978 A1 * | 5/2017 | Li | G01R 1/06722 |
| 2019/0187176 A1 * | 6/2019 | Liu | G01R 1/06716 |

* cited by examiner

*Primary Examiner* — Dominic E Hawkins
(74) *Attorney, Agent, or Firm* — Muncy, Geissler, Olds & Lowe, P.C.

(57) ABSTRACT

An electrical probe includes a probe assembly and a second electrical connection member. The probe assembly includes a needle cylinder, a first electrical connection member, a probe head and a sub-probe. The first electrical connection member and the probe head locate to two opposite sides of the needle cylinder. The first electrical connection member and the probe head electrically connect the needle cylinder. The sub-probe penetrates the probe head, and plugs the needle cylinder to electrically connect a cable but being electrically isolated from the needle cylinder. The sub-probe is located on a side away from the first electrical connection member. When the probe head depresses the object, the needle cylinder drives the first cylinder to a contact position to allow the first electrical connection member to electrically contact the second electrical connection member, and thus the probe head connects the second electrical connection member via the needle cylinder.

10 Claims, 6 Drawing Sheets

ELECTRICAL PROBE

This application claims the benefit of Taiwan Patent Application Serial No. 106145876, filed on Dec. 27, 2017, the subject matter of which is incorporated herein by reference.

BACKGROUND OF THE INVENTION

1. Field of the Invention

The invention relates to an electrical probe, and more particularly to the electrical probe that includes a first electrical connection member and a second electrical connection member to pair the first electrical connection member.

2. Description of the Prior Art

Currently, various instruments able to measure electric properties such as resistance and voltages are provided in the art. Among these instruments, some may implement large currents (ranging 10s to 100s amperes for example) to carry out corresponding measurements. Before the shipment, manufacturers of these large-current measuring instruments usually apply several probe sets to perform electric testing simultaneously at multiple points thereof so as to further verify the yield and the reliability of the product. In particularly, the probe sets of the measuring instrument, generally fixed onto a base plate, usually include a driving end and a sensing end, connecting respective wires. When the probe set touches an object to be tested, a large current would flow to the object via the driving end, and then a voltage induced by the current to cross the object would be fed back to the probe set via the sensing end, such that the related electric properties of the object can be realized.

In the aforesaid probe set, since the wire connecting the driving end is to output the large current, thus a size of this wire would be comparatively larger. Hence, it would be too crowded to include several probe sets on the same measuring instrument. With the large current to flow through the wire, a severe heat-dissipation problem would be emerged, from which a consequent increase in resistance of the wire would hinder the flow of the large current. In addition, while the probe set slides after contacting the object to be tested, the wire inside the measuring instrument would be moved as well, and thereby possible abrasion or wear would occur between the wire and neighboring internal components of the measuring instrument. In a worse situation, a possible short cut from the worn wire would fail the measuring instrument. Also, in the arts, the wire of the probe set shall be disassembled firstly before a service or maintenance task can be proceeded. Till the service or maintenance task is done, then the wire can be reassembled. However, it is quite possible that positive/negative terminals would be mislocated to further fail the measuring instrument.

SUMMARY OF THE INVENTION

Accordingly, it is an object of the present invention to provide an electrical probe that can resolve substantially the aforesaid shortcomings of the measuring instrument in heat dissipating caused by crowding the wires inside the measuring instrument, in wearing the wire that moves with the probe head, and in misplacing the wires.

In the present invention, the electrical probe, mounted on a base plate and electrically coupled with a cable, is to measure electric properties of an object to be tested. The electrical probe includes a probe assembly and a second electrical connection member. The probe assembly includes a needle cylinder, a first electrical connection member, a probe head and a sub-probe. The needle cylinder, movably penetrating the base plate, has a wiring aperture for the cable to pass through. The first electrical connection member is furnished to and electrically coupled with the needle cylinder. The probe head, mounted at an end of the needle cylinder away from the first electrical connection member and electrically coupled with the needle cylinder, is to depress the object to be tested. The sub-probe, penetrating the probe head and plugging the needle cylinder, also electrically coupled with the cable but electrically isolated from the needle cylinder, is located at a side of the needle cylinder away from the first electrical connection member. The second electrical connection member is to contact the first electrical connection member. When the probe head depresses the object to be tested so as to move the first electrical connection member from a separation position to a contact position, the first electrical connection member contacts the second electrical connection member, so that the probe head electrically couples the second electrical connection member via the needle cylinder and the first electrical connection member.

As stated above, by providing the electrical probe of the present invention, since the cable for transmitting electricity to the probe head is stationary in the second electrical connection member, not to move with the first electrical connection member and the needle cylinder, thus possible abrasion upon the cable caused by relative movement with the needle cylinder would be substantially reduced upon when the probe head contacts the object to be tested.

In addition, by including the first electrical connection member and the second electrical connection member to replace part of wiring, thus no excessive wiring flowing the large current exists in the probe assembly to generate heat, and hence the conventional shortcomings in crowded wires and heat dissipation can be substantially resolved.

Furthermore, since the cable is connected with the second electrical connection member, not with the first electrical connection member, thus no more disassembly of the probe assembly is needed for performing maintenance, and thereby mistakes in connecting the wires can be effectively avoided.

All these objects are achieved by the electrical probe described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an electrical probe. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
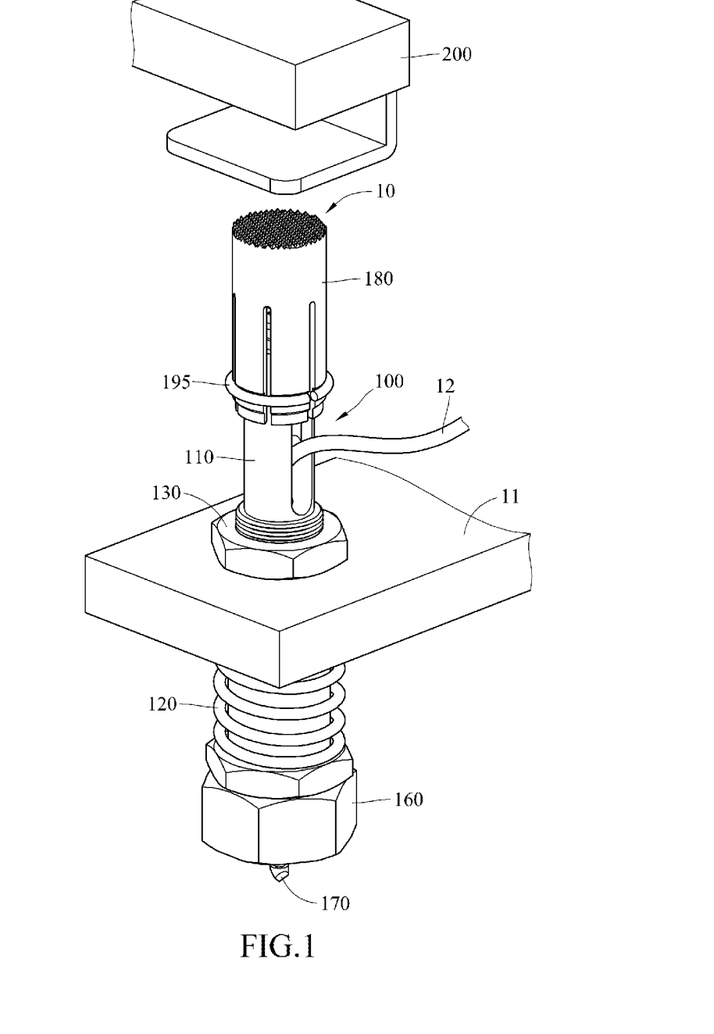
FIG. 1 is a schematic perspective view of a first embodiment of the electrical probe mounted on a base plate in accordance with the present invention.
Figure 2:
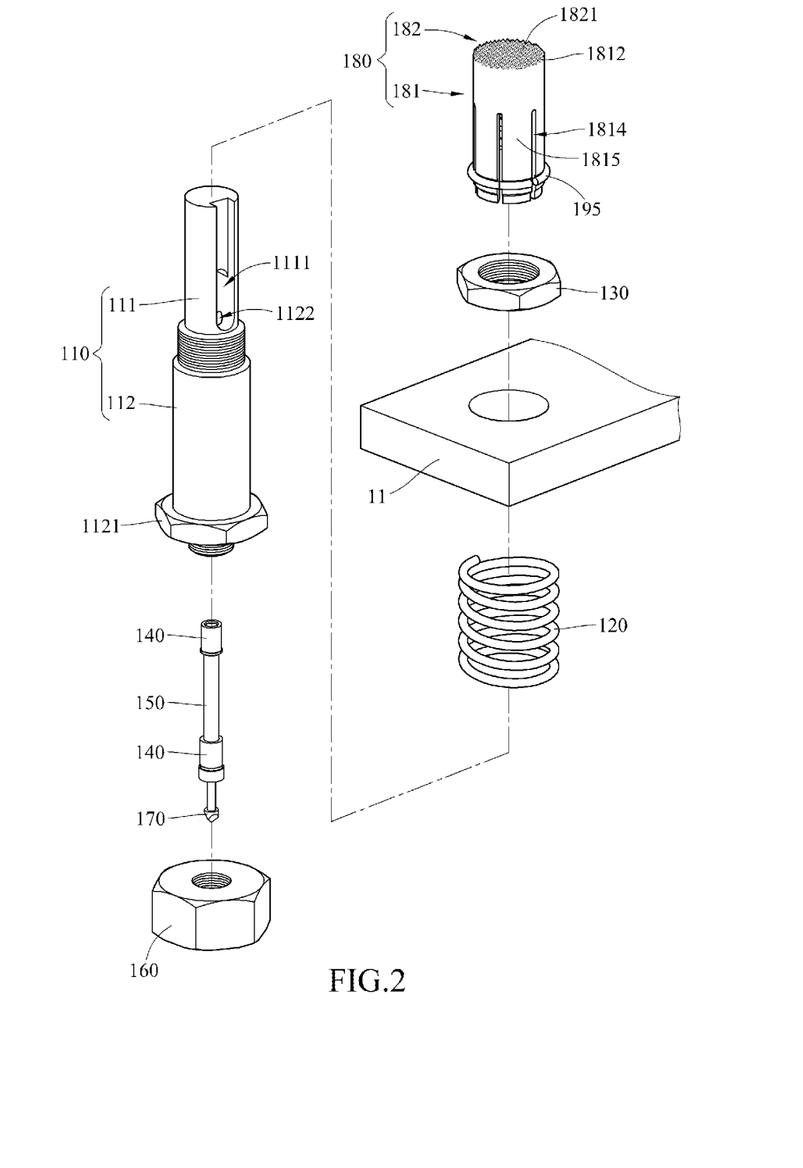
FIG. 2 is a schematic exploded view of FIG. 1 without the second electrical connection member.
Figure 3:
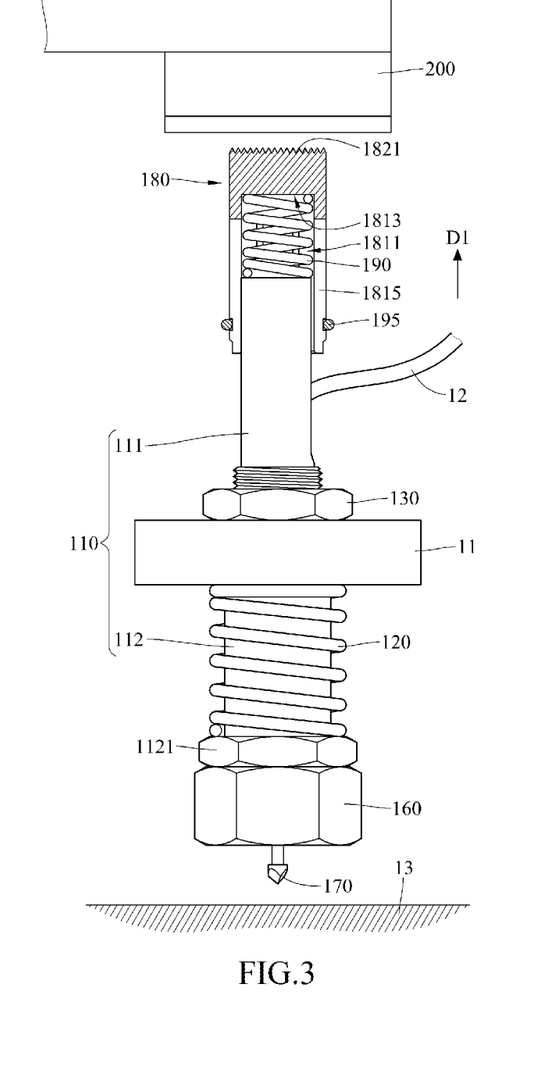
FIG. 3 is a schematic cross-sectional view upon a part of FIG. 1.

Please refer now to FIG. 1 to FIG. 3; where FIG. 1 is a schematic perspective view of a first embodiment of the electrical probe mounted on a base plate in accordance with the present invention, FIG. 2 is a schematic exploded view of FIG. 1 without the second electrical connection member, and FIG. 3 is a schematic cross-sectional view upon a part of FIG. 1

In this first embodiment, the base plate 11 made of an insulating material may be furnished with a plurality of the electrical probes 10, though only one shown in the figure. Each of the electrical probes 10, electrically coupled with a cable 12, transmits the current fed back from an object to be tested 13 via the cable 12. The electrical probe 10 can utilize a large current (ranging from 10s to 100s amperes for example) to measure electric properties of the object to be tested 13, such as resistance and/or voltages. In the following description, one electrical probe 10 is raised from elucidating the present invention.

As shown, the electrical probe 10 includes a probe assembly 100 and a second electrical connection member 200. The probe assembly 100 includes a needle cylinder 110, an external elastic member 120, two fasteners 130, two insulators 140, a needle tube 150, a probe head 160, a sub-probe 170, a first electrical connection member 180, an internal elastic member 190 and an anchor ring 195.

The needle cylinder 110 for penetrating movably through the base plate 11 includes axially a first shaft portion 111 and a second shaft portion 112. The first shaft portion 111 and the second shaft portion 112 are protruded from two opposing sides of the base plate 11, respectively. The second shaft portion 112 having an end flange 1121 is sleeved by the external elastic member 120, with the end flange 1121 and the base plate 11 to restrain two opposing ends of the external elastic member 120 by contacting. The fastener 130 fixed the first shaft portion 111 by contacting the base plate 11 at the side away from the second shaft portion 112.

In this embodiment, one fastener 130 is furnished. However, in other embodiment, the number of the fasteners may be more than two.

The first shaft portion 111 has a wiring aperture 1111 for the cable 12 to pass through. The second shaft portion 112 further has an accommodation tunnel 1122 inside the second shaft portion 112 extending throughout the second shaft portion 112 to communicate spatially with the wiring aperture 1111. The two insulators 140 and the needle tube 150 are all installed inside the accommodation tunnel 1122, with the two insulators 140 sleeved the needle tube 150. Namely, each of the two insulators 140 is located between the second shaft portion 112 and the needle tube 150. The probe head 160, furnished to the second shaft portion 112 at the end away from the first shaft portion 111, is electrically coupled with the needle cylinder 110. The probe head 160 is used to depress the object to be tested 13. The sub-probe 170 penetrating the probe head 160 is plugged into the needle tube 150 inside the accommodation tunnel 1122 of the second shaft portion 112. For the cable 12 is electrically coupled with the needle tube 150, so the sub-probe 170 is thus electrically coupled with the cable 12 via the needle tube 150, where the needle tube 150 is electrically isolated from the second shaft portion 112 by the two insulators 140.

The first electrical connection member 180 includes a cylindrical shell 181 and a conductive portion 182. The cylindrical shell 181 has an insert hole 1811, an end surface 1812, a blind-hole bottom 1813 and a plurality of parallel slots 1814. The end surface 1812 is positioned to end the cylindrical shell 181 by locating oppositely with respect to the insert hole 1811. The blind-hole bottom 1813 is located inside the insert hole 1811 by opposing the end surface 1812. These parallel slots 1814 of the cylindrical shell 181, extending from an open end thereof toward the end surface 1812, divide the cylindrical shell 181 into a plurality of claw leaves 1815. The first shaft portion 111 of the needle cylinder 110 is movable to plug the insert hole 1811 of the cylindrical shell 181, and the first electrical connection member 180 is electrically coupled with the needle cylinder 110. The internal elastic member 190, installed in the insert hole 1811 of the cylindrical shell 181, has its two opposing ends to contact the blind-hole bottom 1813 and the first shaft portion 111, respectively. The anchor ring 195 buckles these claw leaves 1815, and thus positions the first shaft portion 111 with these claw leaves 1815. The conductive portion 182, furnished to the end surface 1812, has a plurality of diamond structures 1821. The second electrical connection member 200 is to match these diamond structures 1821 of the first electrical connection member 180.

In this embodiment, the second electrical connection member 200 is to transmit the current to the first electrical connection member 180, and further to the probe head 160 far from the first electrical connection member 180 via the needle cylinder 110. In addition, in this embodiment, the second electrical connection member 200 can be made up from a copper plate with excellent electric conductivity, and these diamond structures 1821 of the first electrical connection member 180 can be used to form multiple electric contact connections with the second electrical connection member 200, such that the voltage bridging the first electrical connection member 180 and the second electrical connection member 200 can be reduced.

In this embodiment, the anchor ring 195 buckling these claw leaves 1815 is to enforce the mounting of the first shaft portion 111. In some other embodiments, by waiving the anchor ring, the claw leaves can be simply applied to clamp the first shaft portion.

In this embodiment, when the probe head 160 depresses the object to be tested 13 so as to slide the first electrical connection member 180 to move from a separation position to a contact position, an electric contact would be formed between the first electrical connection member 180 and the second electrical connection member 200, such that the probe head 160 would be electrically coupled with second electrical connection member 200 via the needle cylinder 110 and the first electrical connection member 180.

Figure 4:
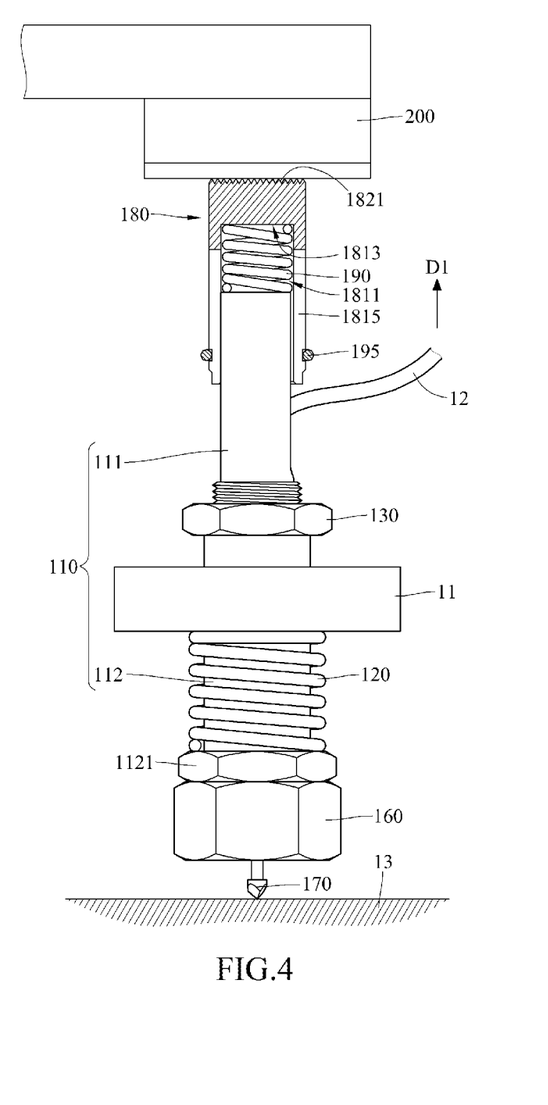
FIG. 4 shows another state of FIG. 3 with the first electrical connection member in a contact position.

In the following description, a process for the electrical probe 10 to measure electric properties of the object to be tested 13 would be elucidated. Refer now to both FIG. 3 and FIG. 4, where FIG. 4 shows another state of FIG. 3 with the first electrical connection member in a contact position.

While in measuring the electric properties of the object to be tested 13, the probe head 160 and the sub-probe 170 of the electrical probe 10 are introduced to depress the object to be tested 13, such that the needle cylinder 110 would move toward the second electrical connection member 200 in a direction D1. Thereupon, these diamond structures 1821 of the first electrical connection member 180, located away from the probe head 160 with respect to the needle cylinder 110, would contact electrically and elastically with the second electrical connection member 200. Namely, the first electrical connection member 180 is at a contact position with the second electrical connection member 200. Then, the probe head 160 can be electrically coupled with the second electrical connection member 200 through the needle cylinder 110 and the first electrical connection member 180. Thus, an electric current charged into the second electrical connection member 200 would flow through the first electrical connection member 180, the needle cylinder 110, to reach the object to be tested 13 that is depressed by the probe head 160. After reaching the object to be tested 13 via the probe head 160, the current would flow to the cable 12 via the sub-probe 170 that is electrically coupled with the cable 12. Through the cable 12, the current flows back to the measuring device having the electrical probe 10, and then the electric properties of the object to be tested 13 can be realized by analyzing the feedback current.

In the present invention, while the probe head 160 is depressed upon the object to be tested 13, a reaction force provided by the object to be tested 13 would push the probe head 160 to retrieve in the direction D1 and so as to have the first electrical connection member 180 to contact the second electrical connection member 200. By having the first electrical connection member 180 to contact the second electrical connection member 200, the internal elastic member 190 nested inside the insert hole 1811 of the cylindrical shell 181 would damp the contact forcing between the first electrical connection member 180 and the second electrical connection member 200, such that the service life of the electrical probe 10 can be prolonged.

In addition, the elastic displacement of the internal elastic member 190 may also compensate possible dimensional errors in producing the needle cylinder 110. Thus, when the needle cylinder 110 is at the contact position with the object to be tested 13, an elastic contact is actually formed between the first electrical connection member 180 and the second electrical connection member 200.

During the aforesaid movement of the needle cylinder 110, the end flange 1121 of the second shaft portion 112 of the needle cylinder 110 would depress the external elastic member 120 in the direction D1. After all data have been collected for realizing the electric properties of the object to be tested 13, the probe head 160 can be then disengaged from the object to be tested 13, and thus the elastic energy stored in the compressed external elastic member 120 can be released. At this time, the external elastic member 120 would push the end flange 1121 of the second shaft portion 112 of the needle cylinder 110 back to move the needle cylinder 110 in a direction reverse to the direction D1, such that the first electrical connection member 180 would disengage from the second electrical connection member 200 as the needle cylinder 110 moves. In this embodiment, the external elastic member 120 is helpful to resume an original state of the electrical probe 10 after testing the object to be tested 13. During the needle cylinder 110 moves in the reverse direction of the direction D1, the elastic energy stored in the compressed internal elastic member 190 would be released while the first electrical connection member 180 disengages from the second electrical connection member 200, and the corresponding resilience would push the first electrical connection member 180 away from the first shaft portion 111 of the needle cylinder 110. As soon as the needle cylinder 110 moves the fastener 130 to contact at the base plate 11, the first electrical connection member 180 is at the separation position as shown in FIG. 3.

In this embodiment, since the cable for transmitting electricity to the probe head 160 is stationary in the second electrical connection member 200, not to move with the first electrical connection member 180 and the needle cylinder 110, possible abrasion upon the cable caused by relative movement with the needle cylinder 110 would be substantially reduced upon when the probe head 160 contacts the object to be tested 13.

In addition, by including the first electrical connection member 180 and the second electrical connection member 200 to replace part of wiring, thus no excessive wiring flowing the large current exists in the probe assembly 100 to generate heat, and hence the conventional shortcomings in crowded wires and heat dissipation can be substantially resolved.

Furthermore, since the cable is connected with the second electrical connection member 200, not with the first electrical connection member 180, thus no more disassembly of the probe assembly 100 is needed for performing maintenance, and thereby mistakes in connecting the wires can be effectively avoided.

In this embodiment, since the sub-probe 170 is pluggable with respect to the needle tube 150, thus the sub-probe 170 can be easily replaced from the electrical probe 10, without disassembling the electrical probe 10, such that the replacement convenience of the sub-probe 170 can be further enhanced. In addition, in the electrical probe 10 of this embodiment, since the anchor ring 195 can buckle the first electrical connection member 180 in a detachable manner, thus replacement of the first electrical connection member 180 from the electrical probe 10 can be much easier through disassembling/assembling the anchor ring 195. Thereupon, the replacement convenience of the first electrical connection member 180 is also promoted.

In the first embodiment described above, the diamond structures 1821 of the first electrical connection member 180 are furnished to the end surface 1812 of the cylindrical shell 181. However, in some other embodiments, the diamond structures for forming multiple electric contacts can be furnished to other relevant places. Please refer now to FIG. 5 and FIG. 6; where FIG. 5 is a schematic perspective view of a second embodiment of the electrical probe mounted on the base plate in accordance with the present invention, and FIG. 6 is a schematic perspective view of a third embodiment of the electrical probe mounted on the base plate in accordance with the present invention.

Figure 5:
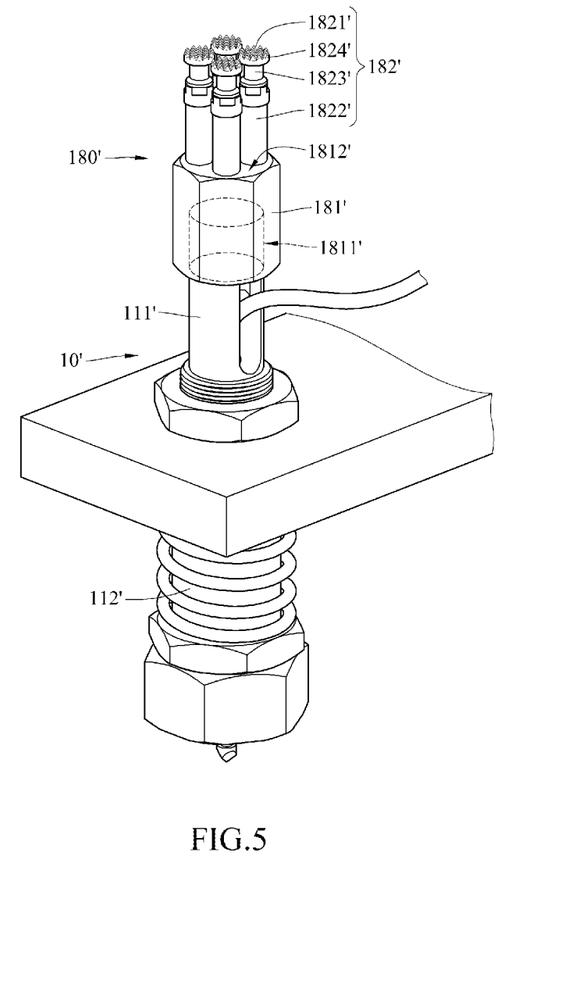
FIG. 5 is a schematic perspective view of a second embodiment of the electrical probe mounted on the base plate in accordance with the present invention.

As shown in FIG. 5, in the electrical probe 10' of this second embodiment, an end of the first shaft portion 111' away from the second shaft portion 112' is fixed inside the insert hole 1811' of the cylindrical shell 181' of the first electrical connection member 180', and a plurality of the conductive portions 182' are included. Each of the conductive portions 182' includes orderly, in a connected manner, a mounting pillar 1822', a sliding pillar 1823' and a conductive head 1824'. These mounting pillars 1822' are all plugged into the end surface 1812' of the cylindrical shell 181', and these sliding pillars 1823' are slidable with respect to the corresponding mounting pillars 1822'. The diamond structures 1821' area furnished to top the conductive heads 1824'. When the first electrical connection member 180' is at the contact position, these diamond structures 1821' would elastically contact the second electrical connection member (referring to FIG. 4).

Figure 6:
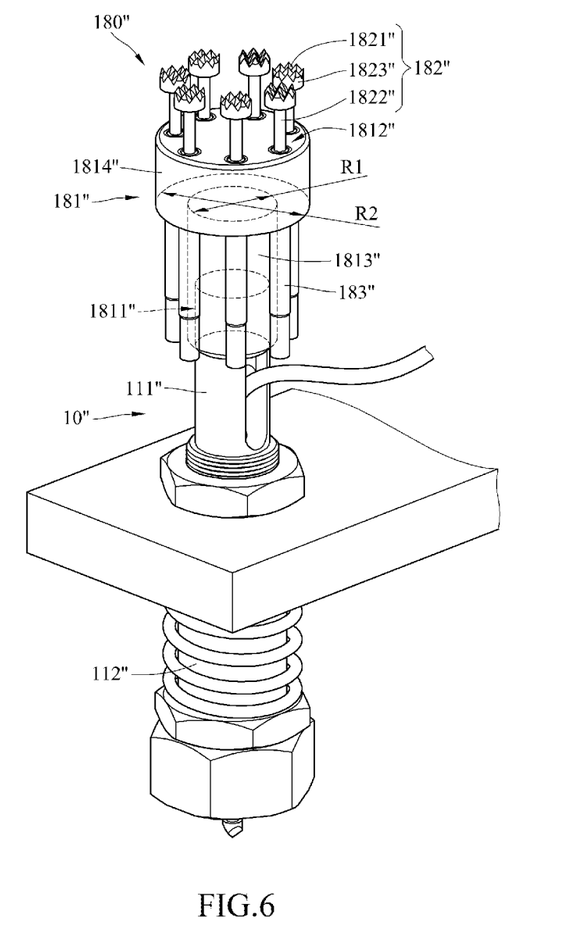
FIG. 6 is a schematic perspective view of a third embodiment of the electrical probe mounted on the base plate in accordance with the present invention.

As shown in FIG. 6, in the electrical probe 10" of this third embodiment, the first electrical connection member 180" further includes a plurality of assembly-pillar portions 183", and the cylindrical shell 181" of the first electrical connection member 180" includes, in a connected manner, a first pillar portion 1813" and a second pillar portion 1814". A diameter R1 of the first pillar portion 1813" is smaller than that R2 of the second pillar portion 1814". These assembly-pillar portions 183" surround the first pillar portion 1813" and connect the second pillar portion 1814". The end surface 1812" is located at an end of the second pillar portion 1814" away from the first pillar portion 1813". The insert hole 1811" is located inside the first pillar portion 1813". Each of a plurality of conductive portions 182" includes a mounting pillar 1822" and a conductive head 1823". The diamond structures 1821" are furnished to top each of the conductive heads 1823". The mounting pillars 1822" penetrate through the end surface 1812" in a movable manner, and then plug the respective assembly-pillar portions 183". An end of the first shaft portion 111" away from the second shaft portion 112" is fixed inside the insert hole 1811". When the first electrical connection member 180" is at the contact position, these conductive heads 1823" would elastically contact the second electrical connection member (referring to FIG. 4).

According to the electrical probe provided by any of the aforesaid embodiments, since the cable for transmitting electricity to the probe head is stationary in the second electrical connection member, not to move with the first electrical connection member and the needle cylinder, thus possible abrasion upon the cable caused by relative movement with the needle cylinder would be substantially reduced upon when the probe head contacts the object to be tested.

In addition, by including the first electrical connection member and the second electrical connection member to replace part of wiring, thus no excessive wiring flowing the large current exists in the probe assembly to generate heat, and hence the conventional shortcomings in crowded wires and heat dissipation can be substantially resolved.

Furthermore, since the cable is connected with the second electrical connection member, not with the first electrical connection member, thus no more disassembly of the probe assembly is needed for performing maintenance, and thereby mistakes in connecting the wires can be effectively avoided.

In the present invention, the internal elastic member nested inside the insert hole of the cylindrical shell would effectively damp the contact forcing between the first electrical connection member and the second electrical connection member, such that the service life of the first electrical connection member can be substantially prolonged. In addition, the elastic displacement of the internal elastic member may compensate possible dimensional errors in producing the needle cylinder, and thus, when the needle cylinder is at the contact position with the object to be tested, an elastic contact can be formed between the first electrical connection member and the second electrical connection member. Also, the inclusion of the external elastic member is helpful to resume the original state of the electrical probe after testing the object to be tested.

While the present invention has been particularly shown and described with reference to a preferred embodiment, it will be understood by those skilled in the art that various changes in form and detail may be without departing from the spirit and scope of the present invention.

What is claimed is:

1. An electrical probe, mounted on a base plate and electrically coupled with a cable, being to measure electric properties of an object to be tested, comprising:
   a probe assembly, including:
      a needle cylinder, movably penetrating the base plate, having a wiring aperture for the cable to pass through;
      a first electrical connection member, furnished to and electrically coupled with the needle cylinder;
      a probe head, mounted at an end of the needle cylinder away from the first electrical connection member, electrically coupled with the needle cylinder, being to depress the object to be tested; and
      a sub-probe, penetrating the probe head and plugging the needle cylinder, electrically coupled with the cable but electrically isolated from the needle cylinder, located at a side of the needle cylinder away from the first electrical connection member; and
   a second electrical connection member for contacting the first electrical connection member;
   wherein, when the probe head depresses the object to be tested so as to move the first electrical connection member from a separation position to a contact position, the first electrical connection member contacts the second electrical connection member, so that the probe head electrically couples with the second electrical connection member via the needle cylinder and the first electrical connection member.

2. The electrical probe of claim 1, wherein the probe assembly further includes an external elastic member and at least one fastener, the needle cylinder includes axially a first shaft portion and a second shaft portion, the first shaft portion and the second shaft portion protrude from two opposing sides of the base plate, the first electrical connection member sleeves the first shaft portion, the wiring aperture is located at the first shaft portion, the probe head is mounted at an end of the second shaft portion away from the first shaft portion, the sub-probe plugs the second shaft portion, the second shaft portion has an end flange, the second shaft portion penetrates the external elastic member with the end flange and the base plate to restrain the external elastic member in between, and the at least one fastener sleeves the first shaft portion and contacts detachably the base plate; wherein, when the first electrical connection member is at the separation position, the at least one fastener contacts the base plate.

3. The electrical probe of claim 2, wherein the second shaft portion has an accommodation tunnel extending inside the second shaft portion to communicate spatially with the wiring aperture of the first shaft portion, the probe assembly further includes a needle tube located inside the accommodation tunnel, the sub-probe plugs the needle tube and thus is located inside the accommodation tunnel, and the cable electrically couples with the needle tube so as to have the sub-probe to electrically couple the cable via the needle tube.

4. The electrical probe of claim 3, wherein the probe assembly further includes at least one insulator located inside the accommodation tunnel, the needle tube penetrates the at least one insulator so as to have the at least one insulator to position between the second shaft portion and the needle tube, and the needle tube is electrically isolated from the second shaft portion via the at least one insulator.

5. The electrical probe of claim 2, wherein the first electrical connection member includes a cylindrical shell and at least one conductive portion, the cylindrical shell has an insert hole and an end surface, the end surface backs onto the insert hole and is located away from the first shaft portion, the at least one conductive portion is located on the end surface, and the first shaft portion plugs the insert hole; wherein, when the first electrical connection member is at the contact position, the at least one conductive portion electrically contacts the second electrical connection member.

6. The electrical probe of claim 5, wherein the probe assembly further includes an anchor ring, the cylindrical shell further has a plurality of slots extending from an open end of the cylindrical shell toward the end surface and dividing the cylindrical shell into a plurality of claw leaves, the plurality of claw leaves clamp the first shaft portion, and the anchor ring buckles the plurality of claw leaves.

7. The electrical probe of claim 5, wherein the probe assembly further includes an internal elastic member, the first shaft portion movably plugs the insert hole of the cylindrical shell, the cylindrical shell has a blind-hole bottom inside the insert hole by opposing the end surface, and the internal elastic member is located inside the insert hole with two opposing ends of the internal elastic member contacting respectively the blind-hole bottom and the first shaft portion; wherein, when the first electrical connection member is at the contact position, the first shaft portion depresses the second electrical connection member to compress the internal elastic member.

8. The electrical probe of claim 5, wherein an end of the first shaft portion away from the second shaft portion is fixed inside the insert hole of the cylindrical shell of the first electrical connection member, the number of the at least one conductive portion is more than two, each of the conductive portions includes orderly, in a connected manner, a mounting pillar, a sliding pillar and a conductive head, the mounting pillar plugs on the end surface, and the conductive head is slidable with respect to the corresponding sliding pillar; wherein, when the first electrical connection member is at the contact position, the conductive head elastically contacts the second electrical connection member.

9. The electrical probe of claim 5, wherein the first electrical connection member further includes a plurality of assembly-pillar portions, the cylindrical shell of the first electrical connection member includes a first pillar portion and a second pillar portion connected with the first pillar portion, the first pillar portion has a diameter smaller than that of the second pillar portion, the plurality of assembly-pillar portions surround the first pillar portion and connect to the second pillar portion, the end surface is located at a side of the second pillar portion away from the first pillar portion, the insert hole is located at the first pillar portion, the number of the at least one conductive portion is more than two, each of the conductive portions includes a mounting pillar and a conductive head, the mounting pillar penetrates movably the end surface and plugs the corresponding assembly-pillar portions, and an end of the first shaft portion away from the second shaft portion is fixed inside the insert hole; wherein, when the first electrical connection member is at the contact position, the conductive head electrically contacts the second electrical connection member.

10. The electrical probe of claim 5, wherein the conductive portion of the first electrical connection member has a plurality of diamond structures; wherein, when the first electrical connection member is at the contact position, the plurality of diamond structures elastically contact the second electrical connection member.

* * * * *